(12) United States Patent
Park

(10) Patent No.: US 10,867,796 B2
(45) Date of Patent: Dec. 15, 2020

(54) METHOD OF FORMING A PATTERN

(71) Applicant: SAMSUNG ELECTRONICS CO., LTD., Suwon-si (KR)

(72) Inventor: Jongchul Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/514,643

(22) Filed: Jul. 17, 2019

(65) Prior Publication Data

US 2019/0341258 A1 Nov. 7, 2019

Related U.S. Application Data

(63) Continuation of application No. 15/923,014, filed on Mar. 16, 2018, now Pat. No. 10,522,351.

(30) Foreign Application Priority Data

Aug. 21, 2017 (KR) .......................... 10-2017-0105667

(51) Int. Cl.
*H01L 21/033* (2006.01)
*H01L 21/67* (2006.01)
*H01J 37/32* (2006.01)
*H01L 21/311* (2006.01)
*H01L 21/3213* (2006.01)

(52) U.S. Cl.
CPC .... *H01L 21/0338* (2013.01); *H01J 37/32422* (2013.01); *H01L 21/0335* (2013.01); *H01L 21/0337* (2013.01); *H01L 21/31105* (2013.01); *H01L 21/31116* (2013.01); *H01L 21/31144* (2013.01); *H01L 21/32131* (2013.01); *H01L 21/32136* (2013.01); *H01L 21/32139* (2013.01);
(Continued)

(58) Field of Classification Search
CPC .......... H01J 27/32437; H01J 2237/334; H01J 37/32422; H01J 37/32357; H01J 2237/3341; H01J 2237/3151; H01L 21/31116; H01L 21/0337; H01L 21/31144; H01L 21/32136; H01L 21/32139; H01L 21/31105; H01L 21/3114; H01L 21/0338; H01L 21/32137; H01L 21/31138; H01L 21/32131
See application file for complete search history.

(56) References Cited

U.S. PATENT DOCUMENTS 4,272,348 A 6/1981 Cox et al.
4,384,346 A 5/1983 Collins et al.
(Continued)

FOREIGN PATENT DOCUMENTS

KR 10-2013-0053191 A 5/2013

*Primary Examiner* — Caridad Everhart
(74) *Attorney, Agent, or Firm* — Lee IP Law, P.C.

(57) ABSTRACT

A method of forming a pattern includes forming a lower layer on a substrate, forming a mask pattern on the lower layer, the mask pattern extending in a first direction parallel to a top surface of the substrate, and performing an etching process using an ion beam on the substrate, such that the ion beam is irradiated in parallel to a plane defined by the first direction and a direction perpendicular to the top surface of the substrate, and is irradiated at a tilt angle with respect to the top surface of the substrate, wherein performing the etching process includes adjusting the tilt angle of the ion beam to selectively etch the lower layer or the mask pattern.

20 Claims, 10 Drawing Sheets

(52) U.S. Cl.
CPC .. _H01L 21/67069_ (2013.01); _H01J 2237/334_
(2013.01)

(56) References Cited

U.S. PATENT DOCUMENTS

| | | |
|---|---|---|
| 5,444,007 A | 8/1995 | Tsuchiaki |
| 6,794,256 B1 | 9/2004 | Fuselier et al. |
| 8,133,804 B1 | 3/2012 | Godet et al. |
| 9,190,287 B2 | 11/2015 | Nakagawa et al. |
| 9,536,748 B2 | 1/2017 | Berry, III et al. |
| 2004/0264044 A1* | 12/2004 | Konishi ................ C23C 14/022 |
| | | 360/110 |
| 2014/0077319 A1 | 3/2014 | Noma et al. |
| 2014/0206197 A1* | 7/2014 | Nakagawa .......... H01L 21/3065 |
| | | 438/712 |
| 2015/0090583 A1 | 4/2015 | Kodaira et al. |
| 2015/0104882 A1* | 4/2015 | Jung .................... H01L 27/222 |
| | | 438/3 |
| 2016/0064232 A1 | 3/2016 | Berry, III et al. |
| 2016/0064239 A1 | 3/2016 | Shih et al. |

* cited by examiner

METHOD OF FORMING A PATTERN

CROSS-REFERENCE TO RELATED APPLICATIONS

This is a continuation application based on pending application Ser. No. 15/923,014, filed Mar. 16, 2018, the entire contents of which is hereby incorporated by reference.

Korean Patent Application No. 10-2017-0105667, filed on Aug. 21, 2017, in the Korean Intellectual Property Office, and entitled: "Method of Forming a Pattern," is incorporated by reference herein in its entirety.

BACKGROUND

1. Field

Embodiments relate to a method of forming a pattern and, more particularly, to a method of forming a pattern using an ion beam etching process.

2. Description of the Related Art

Fine patterns may be required to manufacture highly integrated semiconductor devices. To integrate a lot of elements in a small area, an individual element should be formed as small as possible. To achieve this, a pitch of desired patterns should be reduced. The pitch corresponds to a sum of a width of each pattern and a distance between the patterns. Recently, design rules of semiconductor devices have been significantly reduced. However, the formation of patterns having a fine pitch may be difficult due to a resolution limitation of a photolithography process.

SUMMARY

In an aspect, a method of forming a pattern may include forming a lower layer on a substrate, forming a mask pattern, extending in a first direction parallel to a top surface of the substrate, on the lower layer, and performing an etching process using an ion beam on the substrate. The ion beam may be irradiated in parallel to a plane defined by the first direction and a direction perpendicular to the top surface of the substrate and may be irradiated at a tilt angle with respect to the top surface of the substrate. The performing of the etching process may include adjusting the tilt angle of the ion beam to selectively etch the lower layer or the mask pattern.

In an aspect, a method of forming a pattern may include forming a lower layer on a substrate, forming mask patterns, extending in a first direction and spaced apart from each other in a second direction intersecting the first direction, on the lower layer, and performing an etching process using an ion beam on the substrate. The first direction and the second direction may be parallel to a top surface of the substrate. The ion beam may be irradiated at a tilt angle with respect to the top surface of the substrate. The performing of the etching process may include adjusting the tilt angle of the ion beam to selectively etch the lower layer or the mask patterns.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described in detail with reference to the accompanying drawings.

Figure 1:
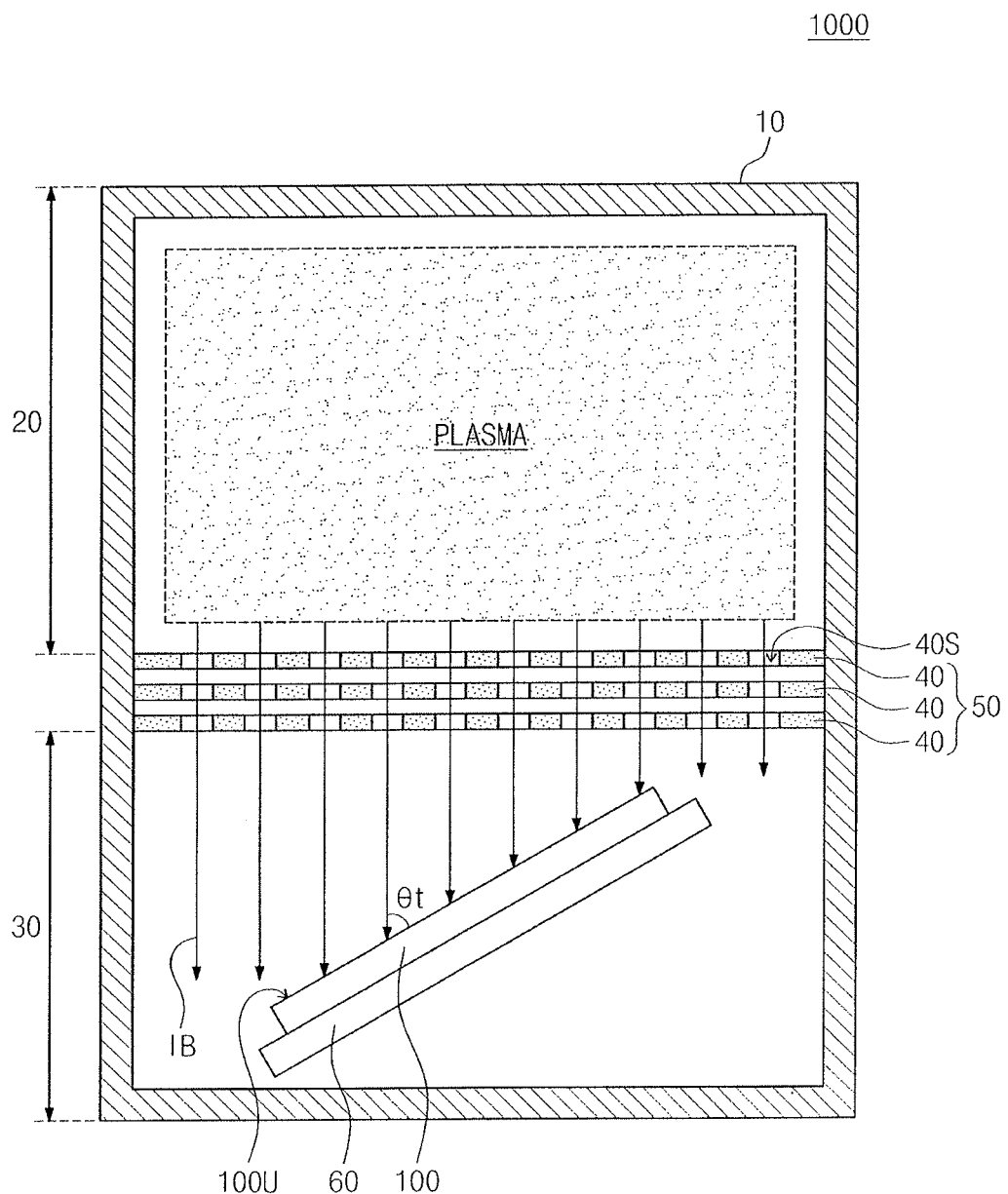
FIG. 1 illustrates a schematic view of an ion beam etching apparatus used in a method of forming patterns according to some embodiments.

FIG. 1 is a schematic view illustrating an ion beam etching apparatus used in a method of forming patterns according to some embodiments.

Referring to FIG. 1, an ion beam etching apparatus 1000 may include a chamber 10 in which an etching process using an ion beam IB is performed. The chamber 10 may include a source part 20 generating plasma and a process part 30 into which the ion beam IB extracted from the plasma is irradiated. The apparatus 1000 may further include a grid 50 that is provided in the chamber 10 and is disposed between the source part 20 and the process part 30. The grid 50 may extract the ion beam IB from the plasma.

In detail, as illustrated in FIG. 1, the grid 50 may include a plurality of electrode plates 40 vertically overlapping with each other, and each of the electrode plates 40 may have a plurality of slits 40S penetrating each of the electrode plates 40, e.g., the electrode plates 40 may be arranged to have the plurality of slits 40S aligned and overlapped with each other. The ion beam IB may be extracted from the plasma by an electric field applied to the plurality of electrode plates 40 and may be accelerated into the process part 30 by the electric field. The ion beam IB may be irradiated into the process part 30 through the slits 40S.

As further illustrated in FIG. 1, the apparatus 1000 may include a stage 60 provided in the process part 30. A substrate 100 provided into the process part 30 may be loaded on the stage 60, e.g., the substrate 100 and the stage 60 may be parallel to each other. The ion beam IB may be irradiated at a tilt angle $\theta t$ with respect to a top surface 100U of the substrate 100, and the etching process using the ion beam IB may be performed on the substrate 100. For example, as illustrated in FIG. 1, the stage 60 with the substrate 100 may be tilted at the tilt angle $\theta t$ relatively to a bottom of the process part 30, and the ion beam IB may be irradiated perpendicularly to the bottom of the process part 30 through the electrode plates 40, so the ion beam IB in incident on the top surface 100U of the substrate 100 at the tilt angle θt. In another example, the stage 60 with the substrate 100 may be parallel to the bottom of the process part 30, and the ion beam IB may be irradiated at tilt angle θt with respect with respect to the bottom of the process part 30 and the top surface 100U of the substrate 100.

Figure 2:
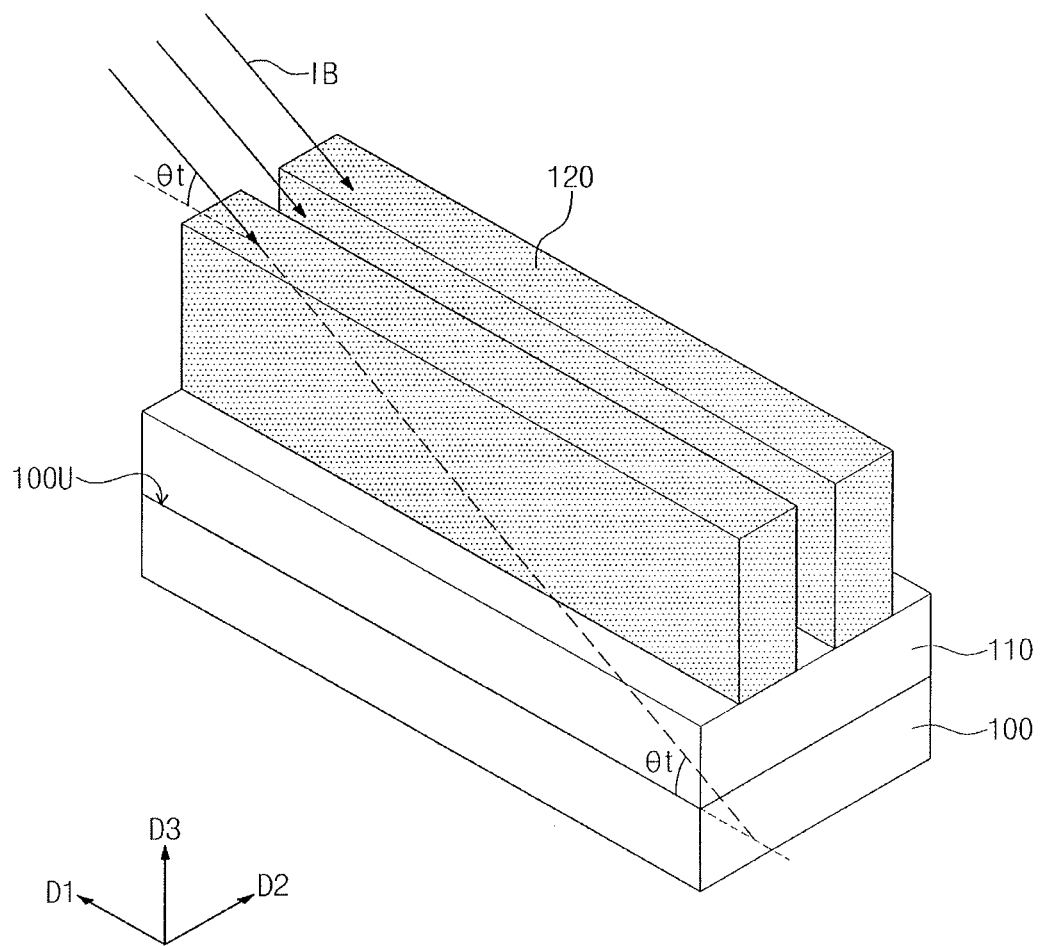
FIGS. 2 and 3 illustrate a perspective view and a plan view of a method of forming patterns according to some embodiments, respectively.
Figure 3:
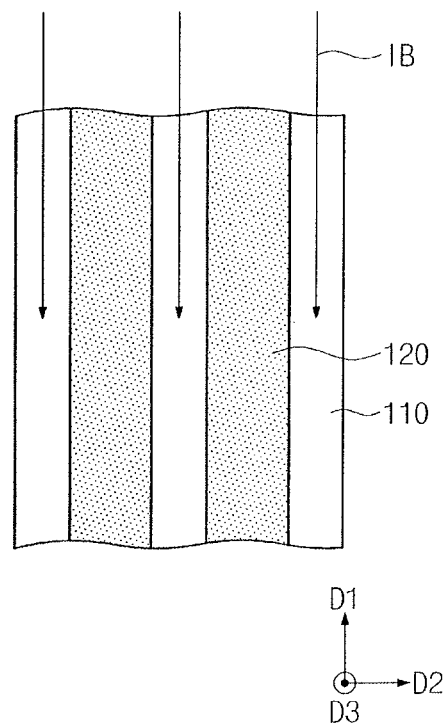
Figure 4:
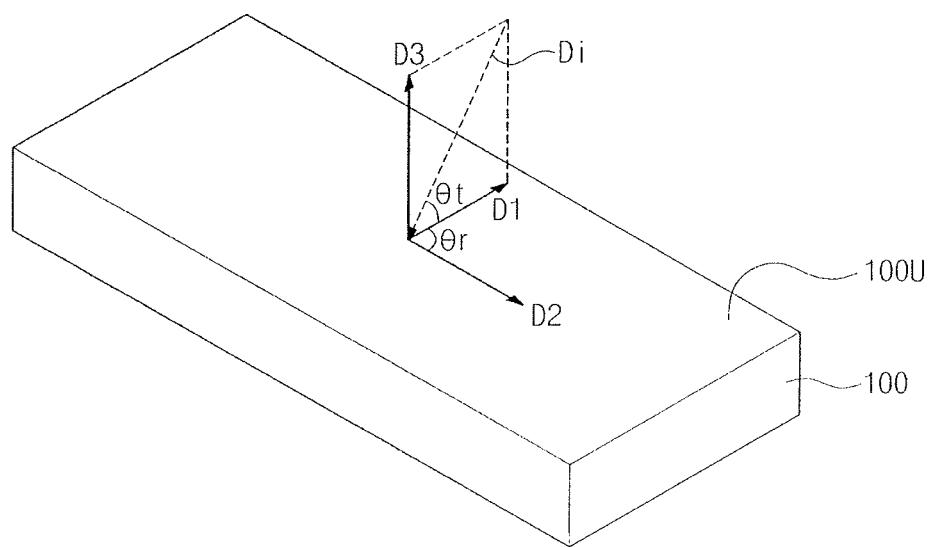
FIG. 4 illustrates a conceptual view of a tilt angle and a rotation angle of an ion beam irradiated onto a substrate of FIG. 2.
Figure 5:
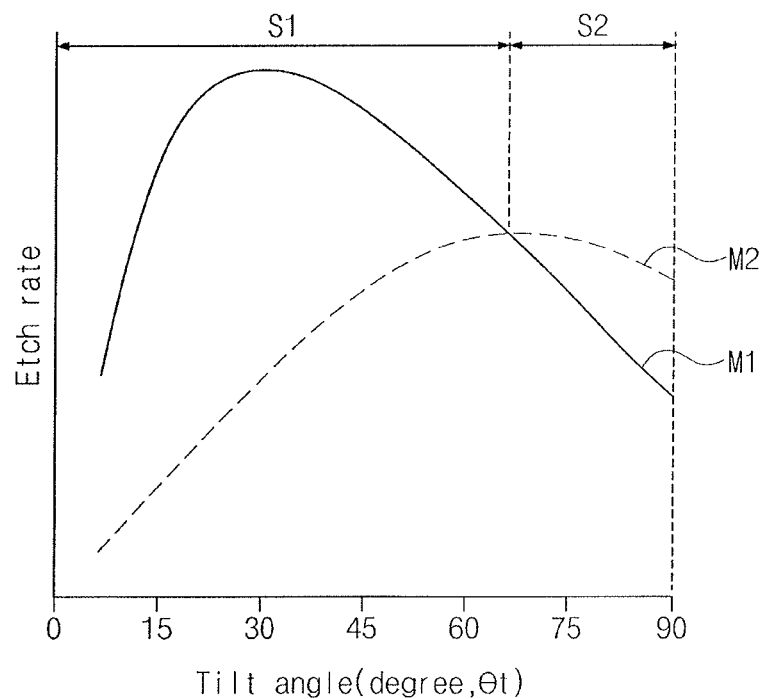
FIG. 5 illustrates a graph of an etch rate according to a tilt angle of an ion beam and a kind of a material layer.

FIGS. 2 and 3 are a perspective view and a plan view illustrating a method of forming patterns according to some embodiments, respectively. FIG. 4 is a conceptual view illustrating the tilt angle θt and a rotation angle of the ion beam IB irradiated onto the substrate 100. FIG. 5 is a graph illustrating an etch rate in accordance with the tilt angle θt of the ion beam IB and a kind of a material layer.

Referring to FIGS. 2 and 3, a lower layer 110 may be provided on the substrate 100, and mask patterns 120 may be provided on the lower layer 110. The mask patterns 120 may extend in a first direction D1, and may be spaced apart from each other in a second direction D2. The first direction D1 and the second direction D2 may be parallel to the top surface 100U of the substrate 100 and may intersect each other. The mask patterns 120 may have linear shapes extending in the first direction D1. The ion beam IB may be irradiated onto the substrate 100 having the mask patterns 120 to perform the etching process. For example, as illustrated in FIGS. 2-3, the ion beam IB may be irradiated onto the substrate 100 along the direction of the linear shapes of the mask patterns 120, e.g., along the first direction D1 when viewed in a plan view, so ion beams IB may be incident on the top surface 100U of the substrate 100 between adjacent mask patterns 120 (FIG. 3), thereby having minimized direct irradiation on major sidewalls of the mask patterns 120 that face each other.

Referring to FIGS. 3 and 4, the ion beam IB which is irradiated to the substrate 100 may be tilted at the tilt angle θt with respect to the top surface 100U of the substrate 100, and may be rotated at a rotation angle θr from the second direction D2. The tilt angle θt may be defined as an angle between the top surface 100U of the substrate 100 and an incident direction Di of the ion beam IB. The rotation angle θr may be defined as an angle between a first plane and a second plane. Here, the first plane may be defined by the second direction D2 and a third direction D3 perpendicular to the top surface 100U of the substrate 100, and the second plane may be defined by the third direction D3 and the incident direction Di of the ion beam IB. The incident direction Di of the ion beam IB may be determined by the tilt angle θt and the rotation angle θr. The incident direction Di of the ion beam IB may be non-perpendicular to the top surface 100U of the substrate 100.

The rotation angle θr may be substantially equal to an angle between the first direction D1 and the second direction D2 on the top surface 100U of the substrate 100. In this case, the incident direction D1 of the ion beam IB may be in the same plane as the first direction D1 and the third direction D3. In other words, the ion beam IB may be irradiated in parallel to a plane defined by the first direction D1 and the third direction D3. For example, the first direction D1 and the second direction D2 may be perpendicular to each other on the top surface 100U of the substrate 100, and the rotation angle θr may be 90 degrees.

The tilt angle θt may be greater than 0 degree and less than 90 degrees. The tilt angle θt may be adjusted in such a way that the mask patterns 120 have an etch selectivity with respect to the lower layer 110 (or the lower layer 110 has an etch selectivity with respect to the mask patterns 120), e.g., the tilt angle θt may be adjusted so the etch selectivity ratio between the mask patterns 120 and the lower layer 110 may be increased as compared to etch selectivity therebetween at a perpendicular ion beam irradiation. The mask patterns 120 may include a different material from the lower layer 110. The tilt angle θt may be adjusted differently depending on materials of the lower layer 110 and the mask patterns 120.

Referring to FIG. 5, in the event that a first material layer M1 is etched by the etching process using the ion beam IB, an etch rate of the first material layer M1 may be maximal when the tilt angle θt of the ion beam IB is a relatively low angle. The first material layer M1 may include at least one of an oxide or a nitride. For example, the first material layer M1 may include at least one of silicon oxide, silicon nitride, or a metal nitride (e.g., titanium nitride (TiN)). In the event that a second material layer M2 is etched by the etching process using the ion beam IB, an etch rate of the second material layer M2 may be maximal when the tilt angle θt of the ion beam IB is a relatively high angle. The second material layer M2 may include a metal (e.g., tungsten (W), tantalum (Ta), or ruthenium (Ru)). When the tilt angle θt of the ion beam IB is a relatively low angle (e.g., in section S1), the etch rate of the first material layer M1 may be higher than the etch rate of the second material layer M2. When the tilt angle θt of the ion beam IB is a relatively high angle (e.g., in section S2), the etch rate of the second material layer M2 may be higher than the etch rate of the first material layer M1.

Referring to FIGS. 2, 3, and 5, according to some embodiments, the lower layer 110 may include the first material layer M1, and the mask patterns 120 may include the second material layer M2. The etching process using the ion beam IB may be performed on the substrate 100 on which the mask patterns 120 are provided. When the tilt angle θt of the ion beam IB is adjusted to a relatively low angle (e.g., an angle greater than 0 degree and equal to or less than 60 degrees), an etch rate of the lower layer 110 may be higher than an etch rate of the mask patterns 120 during the etching process. In other words, since the tilt angle θt of the ion beam IB is adjusted to the relatively low angle during the etching process, the lower layer 110 may be selectively etched. When the tilt angle θt of the ion beam IB is adjusted to a relatively high angle (e.g., an angle greater than 60 degrees and less than 90 degrees), an etch rate of the mask patterns 120 may be higher than an etch rate of the lower layer 110 during the etching process. In other words, since the tilt angle θt of the ion beam IB is adjusted to the relatively high angle during the etching process, the mask patterns 120 may be selectively etched.

According to certain embodiments, the lower layer 110 may include the second material layer M2, and the mask patterns 120 may include the first material layer M1. The etching process using the ion beam IB may be performed on the substrate 100 on which the mask patterns 120 are provided. When the tilt angle θt of the ion beam IB is adjusted to the relatively low angle (e.g., an angle greater than 0 degree and equal to or less than 60 degrees), an etch rate of the mask patterns 120 may be higher than an etch rate of the lower layer 110 during the etching process. In other words, since the tilt angle θt of the ion beam IB is adjusted to the relatively low angle during the etching process, the mask patterns 120 may be selectively etched. When the tilt angle θt of the ion beam IB is adjusted to the relatively high angle (e.g., an angle greater than 60 degrees and less than 90 degrees), an etch rate of the lower layer 110 may be higher than an etch rate of the mask patterns 120 during the etching process. In other words, since the tilt angle θt of the ion beam IB is adjusted to the relatively high angle during the etching process, the lower layer 110 may be selectively etched.

Since the tilt angle θt of the ion beam IB is adjusted depending on the materials of the lower layer 110 and the mask patterns 120, the selective etching of the lower layer 110 or the mask patterns 120 may be easily controlled during the etching process.

Figure 6:
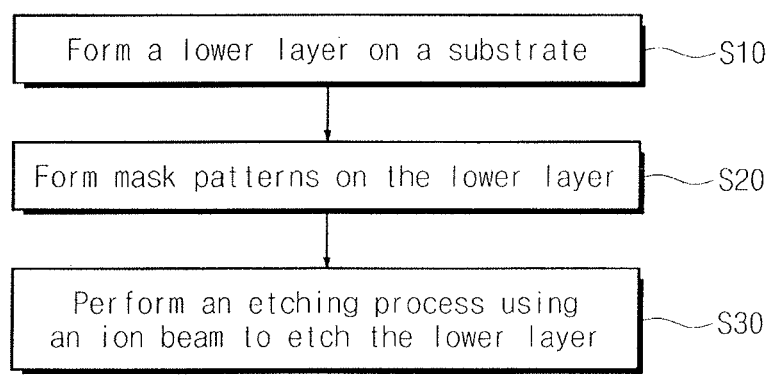
FIG. 6 illustrates a flowchart of a method of forming patterns according to some embodiments.
Figure 7:
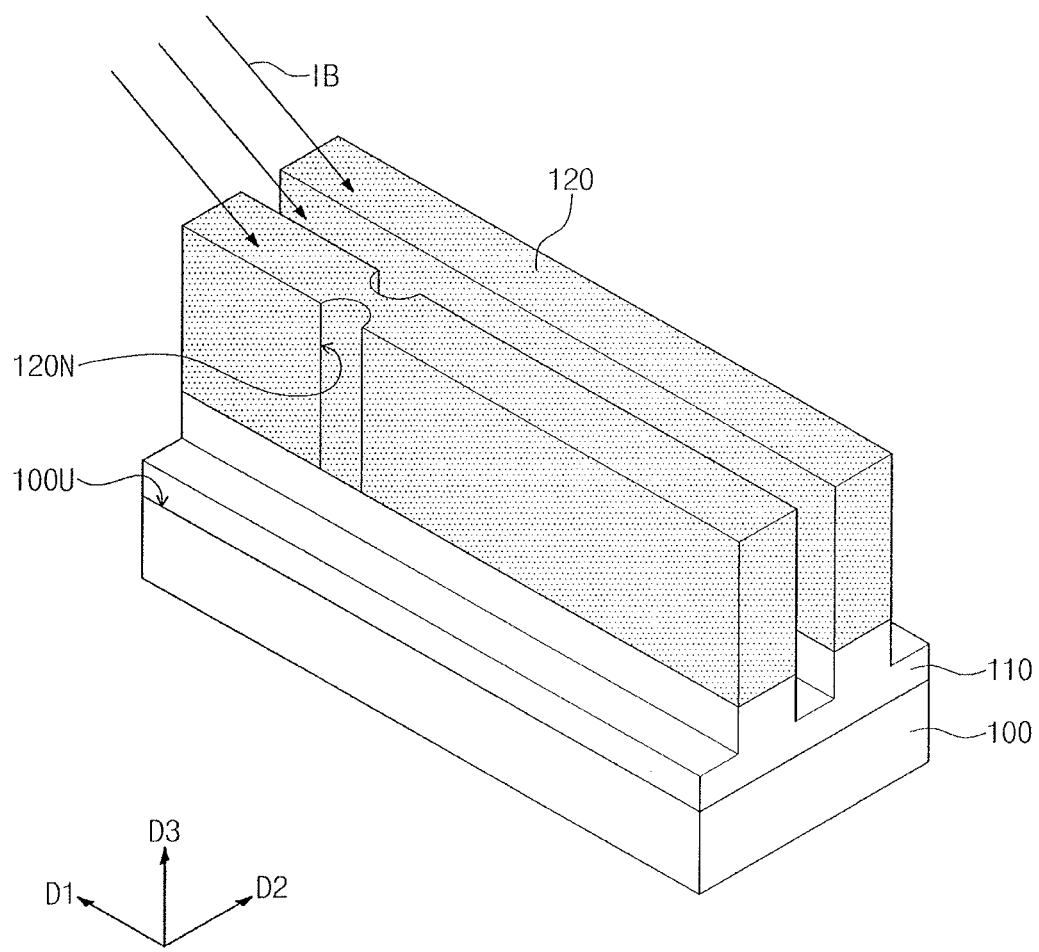
FIGS. 7 and 8 illustrate a perspective view and a plan view of a method of forming patterns according to some embodiments, respectively.
Figure 8:
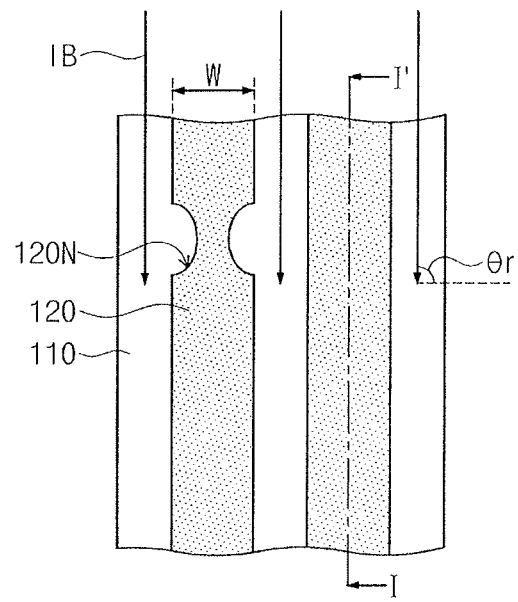
Figure 9:
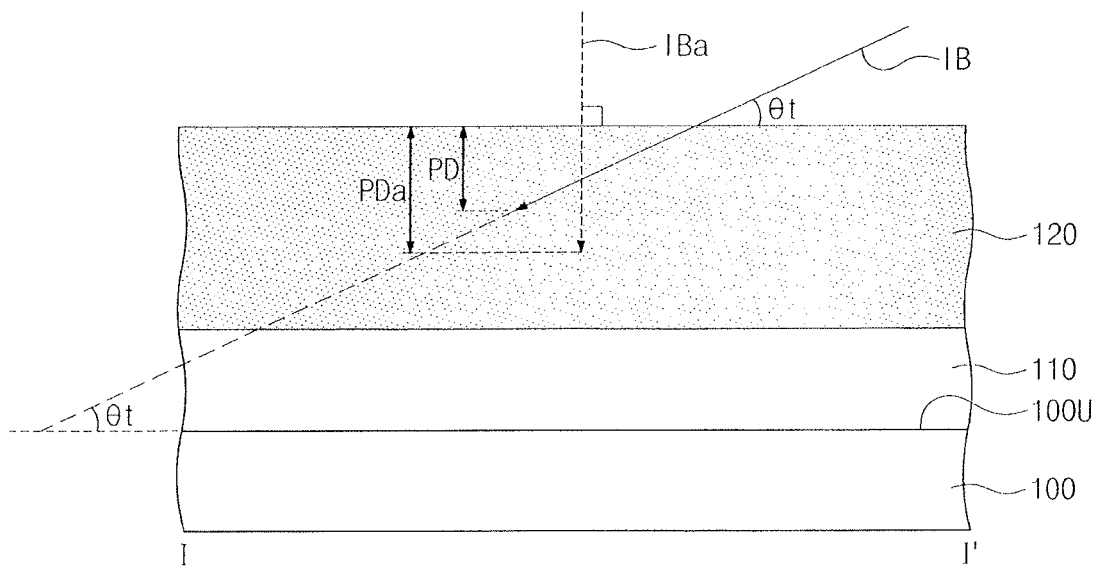
FIG. 9 illustrates a cross-sectional view taken along line I-I' of FIG. 8.

FIG. 6 is a flowchart illustrating a method of forming patterns according to some embodiments. FIGS. 7 and 8 are a perspective view and a plan view illustrating a method of forming patterns according to some embodiments, respectively. FIG. 9 is a cross-sectional view taken along a line I-I' of FIG. 8.

Referring to FIGS. 6 to 9, the lower layer 110 may be formed on the substrate 100 (S10), and the mask patterns 120 may be formed on the lower layer 110 (S20). The mask patterns 120 may extend in the first direction D1 and may be spaced apart from each other in the second direction D2. According to the present embodiments, the mask patterns 120 may have widths W in the second direction D2, and at least one of the mask patterns 120 may include a portion 120N of which a width is relatively narrow, i.e., the width of the portion 120N in the second direction D2 may be smaller than the width W. Hereinafter, the portion 120N is referred to as 'a narrow-width portion 120N'.

The mask patterns 120 may be formed of a material different from that of the lower layer 110. The substrate 100 on which the mask patterns 120 are formed may be loaded on the stage 60 of the ion beam etching apparatus 1000 described with reference to FIG. 1. The ion beam IB may be irradiated toward the top surface 100U of the substrate 100. The etching process using the ion beam IB may be performed to etch the lower layer 110 (S30). The etching process may include selectively etching the lower layer 110 using the mask patterns 120 as an etch mask.

In detail, performing the etching process may include adjusting the tilt angle θt of the ion beam IB, e.g., the tilt angle θt between the ion beam IB and the top surface 100U of the substrate 100 may be an oblique angle. The tilt angle θt of the ion beam IB may be adjusted in such a way that the mask patterns 120 have an etch selectivity with respect to the lower layer 110 (e.g., an etch rate of the lower layer 110 is higher than an etch rate of the mask patterns 120). The tilt angle θt of the ion beam IB may be adjusted to selectively etch the lower layer 110 with respect to the mask patterns 120. For example, when the lower layer 110 includes the first material layer M1 of FIG. 5 and the mask patterns 120 include the second material layer M2 of FIG. 5, the tilt angle θt of the ion beam IB may be adjusted to a relatively low angle (e.g., an angle greater than 0 degree and equal to or less than 60 degrees). In another example, when the lower layer 110 includes the second material layer M2 of FIG. 5 and the mask patterns 120 include the first material layer M1 of FIG. 5, the tilt angle θt of the ion beam IB may be adjusted to a relatively high angle (e.g., an angle greater than 60 degrees and less than 90 degrees). The tilt angle θt of the ion beam IB may be greater than 0 degree and less than 90 degrees.

Performing the etching process may include adjusting the rotation angle θr of the ion beam IB. The rotation angle θr of the ion beam IB may be adjusted in such a way that the ion beam IB is irradiated in parallel to the plane defined by the first direction D1 and the third direction D3. For example, the first direction D1 may be perpendicular to the second direction D2, and the rotation angle θr of the ion beam IB may be 90 degrees.

Referring to FIG. 9, if an ion beam IBa were to be irradiated perpendicularly to the top surface 100U of the substrate 100, a depth PDa to which the ion beam IBa penetrates into the mask pattern 120 would have been relatively great. Thus, a loss of the mask patterns 120 would have increased during the etching process. In addition, if the ion beam IBa were to be irradiated perpendicularly to the top surface 100U of the substrate 100, the narrow-width portion 120N of the mask patterns 120 would have been over-etched to cause a defect (e.g., a cut pattern).

In contrast, according to the present embodiments, the ion beam IB is irradiated at an oblique tilt angle θt with respect to the top surface 100U of the substrate 100. In this case, a depth PD to which the ion beam IB penetrates into the mask pattern 120 may be relatively small, e.g., as compared to the depth PDa. Thus, a loss of the mask patterns 120 may be reduced during the etching process. The ion beam IB may be irradiated to be tilted at the tilt angle θt and may be irradiated in parallel to the plane defined by the first direction D1 and the third direction D3, e.g., along the linear direction of the mask patterns 120 when viewed in a plan view. In this case, etching of the narrow-width portion 120N may be inhibited during the etching process, e.g., as the irradiation along the linear direction of the mask patterns 120 may minimize direct irradiation along corner portions and sidewalls of the mask patterns 120, and thus it may be possible to inhibit a defect (e.g., a cut pattern) from occurring in the mask patterns 120. In addition, a roughness of sidewalls of the mask patterns 120 may be reduced. According to the present embodiments, the selective etching of the lower layer 110 may be easily controlled during the etching process by adjusting the tilt angle θt of the ion beam IB.

Figure 10:
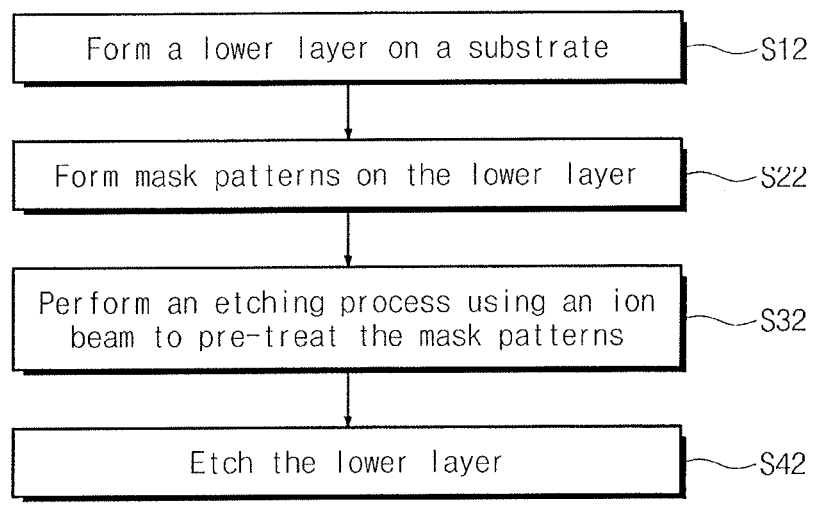
FIG. 10 illustrates a flowchart of a method of forming patterns according to some embodiments.
Figure 11:
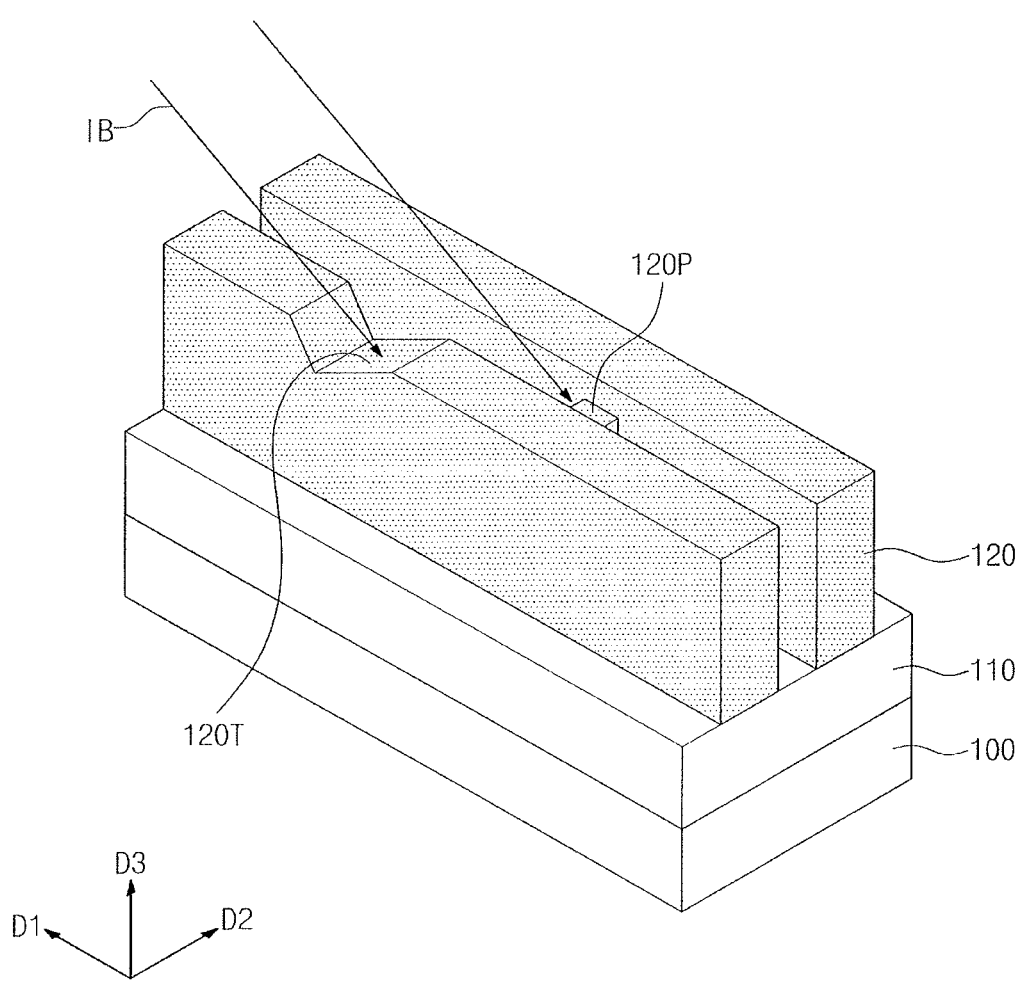
FIGS. 11 and 14 illustrate perspective views of a method of forming patterns according to some embodiments.
Figure 12:
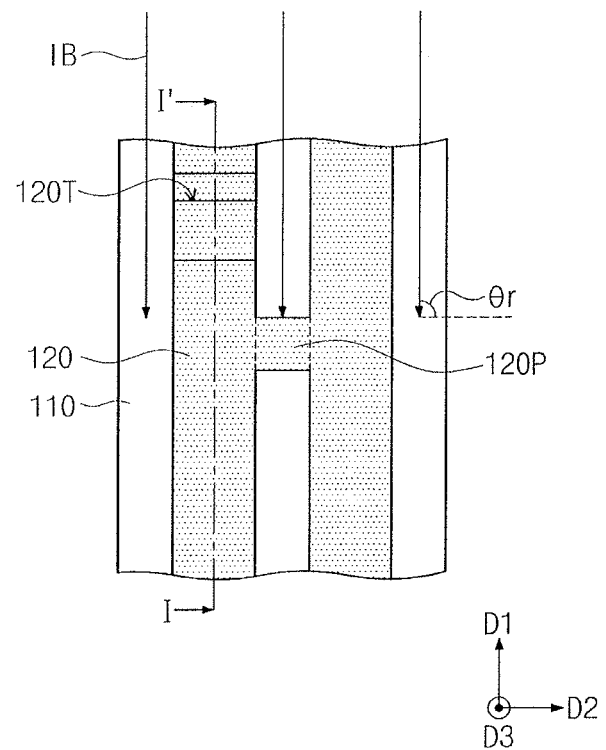
FIG. 12 illustrates a plan view of FIG. 11.
Figure 13:
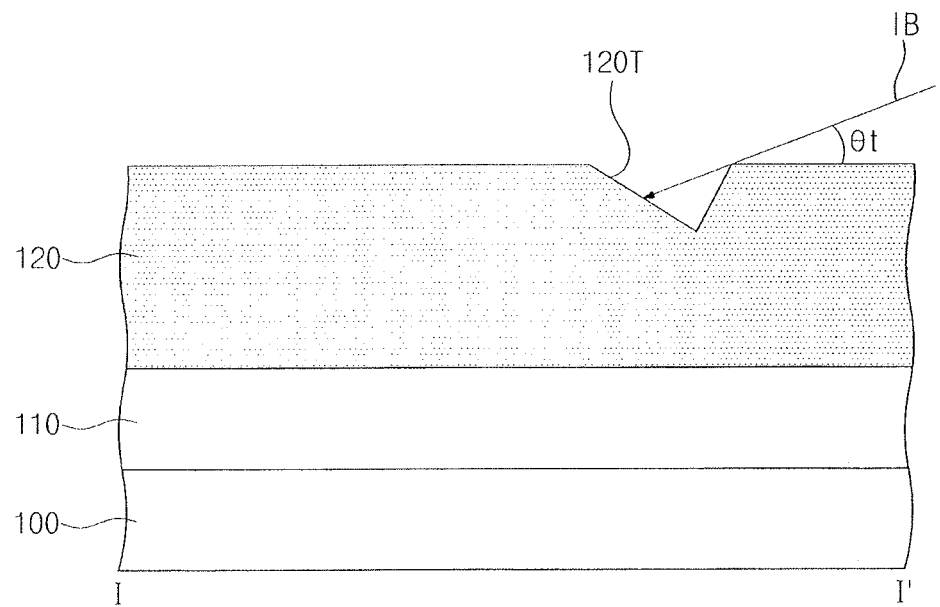
FIG. 13 illustrates a cross-sectional view taken along line I-I' of FIG. 12.
Figure 14:
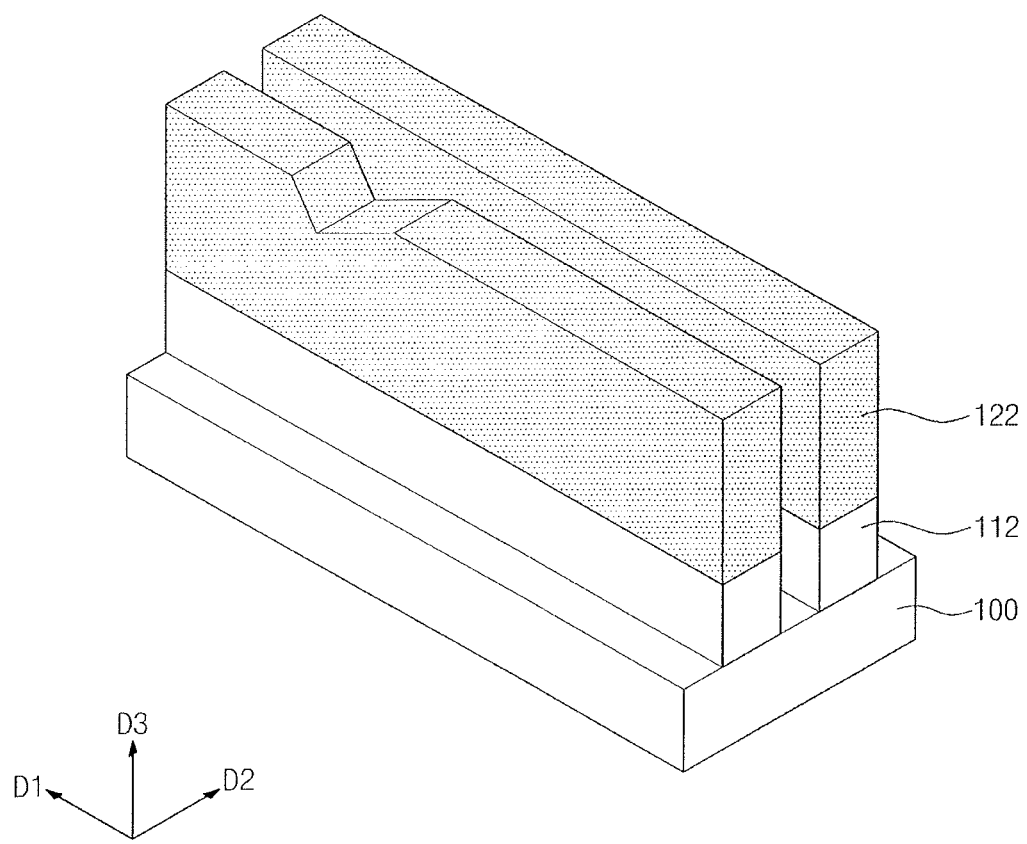

FIG. 10 is a flowchart illustrating a method of forming patterns according to some embodiments. FIGS. 11 and 14 are perspective views illustrating a method of forming patterns according to some embodiments. FIG. 12 is a plan view of FIG. 11, and FIG. 13 is a cross-sectional view taken along line I-I' of FIG. 12.

Referring to FIGS. 10 to 13, the lower layer 110 may be formed on the substrate 100 (S12), and the mask patterns 120 may be formed on the lower layer 110 (S22). The mask patterns 120 may extend in the first direction D1 and may be spaced apart from each other in the second direction D2. According to the present embodiments, at least one protrusion pattern 120P may be provided between the mask patterns 120. The protrusion pattern 120P may be a portion of the mask patterns 120, which extends from a sidewall of at least one of the mask patterns 120. The protrusion pattern 120P may cause a bridge defect between the mask patterns 120 adjacent to each other. At least one of the mask patterns 120 may include a portion 120T of which an upper portion is recessed. Hereinafter, the portion 120T is referred to as 'a notch portion 120T'.

The mask patterns 120 may include a different material from the lower layer 110. The substrate 100 on which the mask patterns 120 are formed may be loaded on the stage 60 of the ion beam etching apparatus 1000 described with reference to FIG. 1. The ion beam IB may be irradiated toward the top surface 100U of the substrate 100. The etching process using the ion beam IB may be performed to pre-treat the mask patterns 120 (S32). The pre-treatment of the mask patterns 120 may include performing the etching process to remove the protrusion pattern 120P disposed between the mask patterns 120 before etching the lower layer 110.

Performing the etching process may include adjusting the tilt angle θt of the ion beam IB. The tilt angle θt of the ion beam IB may be adjusted in such a way that the lower layer 110 has an etch selectivity with respect to the mask patterns 120 (e.g., an etch rate of the mask patterns 120 is higher than an etch rate of the lower layer 110). The tilt angle θt of the ion beam IB may be adjusted to selectively etch the portion (i.e., the protrusion pattern 120P) of the mask patterns 120 with respect to the lower layer 110. For example, when the lower layer 110 includes the first material layer M1 of FIG. 5 and the mask patterns 120 include the second material layer M2 of FIG. 5, the tilt angle θt of the ion beam IB may be adjusted to a relatively high angle (e.g., an angle greater than 60 degrees and less than 90 degrees). In another example, when the lower layer 110 includes the second material layer M2 of FIG. 5 and the mask patterns 120 include the first material layer M1 of FIG. 5, the tilt angle θt of the ion beam IB may be adjusted to a relatively low angle (e.g., an angle greater than 0 degree and equal to or less than 60 degrees). The tilt angle θt of the ion beam IB may be greater than 0 degree and less than 90 degrees.

Performing the etching process may include adjusting the rotation angle θr of the ion beam IB. The rotation angle θr of the ion beam IB may be adjusted in such a way that the ion beam IB is irradiated in parallel to the plane defined by the first direction D1 and the third direction D3. For example, the first direction D1 may be perpendicular to the second direction D2, and the rotation angle θr of the ion beam IB may be 90 degrees.

If an ion beam IBa were to be irradiated perpendicularly to the top surface 100U of the substrate 100 as illustrated in FIG. 9, a depth PDa to which the ion beam IBa penetrates into the mask pattern 120 would have been relatively great. If an etching process using the ion beam IBa is performed to remove the protrusion pattern 120P between the mask patterns 120, the notch portion 120T may be over-etched during the etching process to cause a defect (e.g., a cut pattern).

In contrast, according to the present embodiments, the ion beam IB is irradiated to be tilted at an oblique tilt angle θt with respect to the top surface 100U of the substrate 100 and may be irradiated in parallel to the plane defined by the first direction D1 and the third direction D3. In this case, the protrusion pattern 120P between the mask patterns 120 may be easily removed and the etching of the notch portion 120T may be inhibited during the etching process. In addition, the selective etching of the protrusion pattern 120P may be easily controlled by adjusting the tilt angle θt of the ion beam IB.

Referring to FIGS. 10 and 14, the lower layer 110 may be etched using the pre-treated mask patterns 122 as an etch mask (S42). In some embodiments, the etching of the lower layer 110 may include performing the etching process using the ion beam IB (S30 of FIG. 3), described with reference to FIGS. 6 to 9. In this case, performing the etching process may include selectively etching the lower layer 110 using the pre-treated mask patterns 122 as an etch mask. The tilt angle θt of the ion beam IB may be adjusted in such a way that the lower layer 110 is selectively etched with respect to the pre-treated mask patterns 122, and the rotation angle θr of the ion beam IB may be adjusted in such a way that the ion beam IB is irradiated in parallel to the plane defined by the first direction D1 and the third direction D3. The lower layer 110 may be etched to form lower patterns 112 on the substrate 100.

According to some embodiments, the rotation angle θr and the tilt angle θt of the ion beam IB may be adjusted to minimize defects of the mask patterns 120 during the etching process using the ion beam IB. In addition, the selective etching of the lower layer 110 or the mask patterns 120 may be easily controlled by adjusting the tilt angle θt of the ion beam IB.

Embodiments provide a method of forming a pattern, which is capable of minimizing defects of patterns. Embodiments also provide a method of forming a pattern, which is capable of easily controlling selective etching of a specific layer.

That is, according to embodiments, selective etching of a specific layer may be easily controlled during the etching process using the ion beam by adjusting the tilt angle of the ion beam. In addition, defects of patterns may be minimized during the etching process using the ion beam by adjusting the rotation angle and the tilt angle of the ion beam.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a pattern, the method comprising:
   forming a lower layer on a substrate;
   forming a mask pattern on the lower layer, the mask pattern extending in a first direction parallel to a top surface of the substrate; and
   performing an etching process using an ion beam on the substrate, such that the ion beam is irradiated in parallel to a plane defined by the first direction and a direction perpendicular to the top surface of the substrate, and is irradiated at a tilt angle with respect to the top surface of the substrate,
   wherein performing the etching process includes adjusting the tilt angle of the ion beam, such that etch selectivity between the lower layer and the mask pattern is increased, to selectively etch the lower layer or the mask pattern.

2. The method as claimed in claim 1, wherein one of the lower layer and the mask pattern includes a metal, and the other of the lower layer and the mask pattern includes at least one of an oxide or a nitride.

3. The method as claimed in claim 2, wherein the other of the lower layer and the mask pattern includes at least one of a silicon oxide, a silicon nitride, or a metal nitride.

4. The method as claimed in claim 1, wherein the tilt angle of the ion beam is greater than 0 degree and less than 90 degrees.

5. The method as claimed in claim 1, wherein forming the mask pattern includes forming a plurality of mask patterns extending in the first direction and spaced apart from each other in a second direction intersecting the first direction,
   wherein the second direction is parallel to the top surface of the substrate, and the direction perpendicular to the top surface of the substrate is a third direction, and
   wherein performing the etching process further includes adjusting a rotation angle of the ion beam in such a way that the ion beam is irradiated in parallel to the plane defined by the first direction and the third direction.

6. The method as claimed in claim 1, wherein performing the etching process includes irradiating the ion beam in parallel to the mask pattern, as viewed in a top view.

7. The method as claimed in claim 1, wherein performing the etching process includes irradiating the ion beam such that a majority of the ion beam is incident on a plane parallel to the top surface of the substrate.

8. The method as claimed in claim 1, wherein performing the etching process includes:
adjusting the tilt angle of the ion beam in accordance with a material of the mask pattern; and
pre-treating the mask pattern with the ion beam to remove a portion of the mask pattern before etching the lower layer.

9. The method as claimed in claim 8, wherein pre-treating the mask pattern includes etching the mask pattern with the ion beam at the adjusted tilt angle to remove the portion of the mask pattern before etching the lower layer.

10. The method as claimed in claim 9, wherein performing the etching process further includes etching the lower layer using the pre-treated mask pattern as an etch mask.

11. The method as claimed in claim 10, wherein performing the etching process further includes, before etching the lower layer, re-adjusting the tilt angle of the ion beam in accordance with a material of the lower layer to selectively etch the lower layer with respect to the pre-treated mask pattern.

12. A method of forming a pattern, the method comprising:
forming a lower layer on a substrate;
forming mask patterns on the lower layer, the mask patterns extending in a first direction and being spaced apart from each other in a second direction intersecting the first direction; and
performing an etching process using an ion beam on the substrate,
wherein the first direction and the second direction are parallel to a top surface of the substrate,
wherein the ion beam is irradiated at a tilt angle with respect to the top surface of the substrate,
wherein performing the etching process includes adjusting the tilt angle of the ion beam to be at a low angle or at a high angle, in accordance with materials of the lower layer and the mask pattern, to selectively etch the lower layer or the mask patterns, the low angle being an angle equal to or less than 60 degrees, and the high angle being an angle greater than 60 degrees, and
wherein one of the lower layer and the mask pattern includes a metal, and the other of the lower layer and the mask pattern includes at least one of a silicon oxide, a silicon nitride, or a metal nitride.

13. The method as claimed in claim 12, wherein an incident direction of the ion beam is non-perpendicular to the top surface of the substrate.

14. The method as claimed in claim 12, wherein performing the etching process further includes adjusting a rotation angle of the ion beam in such a way that the ion beam is irradiated in parallel to a plane defined by the first direction and a third direction perpendicular to the top surface of the substrate.

15. The method as claimed in claim 14, wherein the first direction and the second direction are perpendicular to each other, and the rotation angle of the ion beam is 90 degrees.

16. The method as claimed in claim 12, wherein performing the etching process further includes etching the lower layer using the mask patterns as an etch mask,
wherein the lower layer includes at least one of a silicon oxide, a silicon nitride, or a metal nitride, and the mask patterns include a metal, and
wherein the tilt angle of the ion beam is adjusted to an angle greater than 0 degree and equal to or less than 60 degrees.

17. The method as claimed in claim 12, wherein performing the etching process further includes pre-treating the mask patterns to remove at least a portion of the mask patterns before etching the lower layer,
wherein the mask patterns include at least one of a silicon oxide, a silicon nitride, or a metal nitride, and the lower layer includes a metal, and
wherein the tilt angle of the ion beam is adjusted to an angle greater than 0 degree and equal to or less than 60 degrees.

18. A method of forming a pattern, the method comprising:
forming a lower layer on a substrate;
forming mask patterns on the lower layer, the mask patterns extending in a first direction and being spaced apart from each other in a second direction intersecting the first direction, and the mask patterns including a protrusion pattern therebetween; and
performing an etching process using an ion beam on the substrate,
wherein the first direction and the second direction are parallel to a top surface of the substrate,
wherein the ion beam is irradiated at a tilt angle with respect to the top surface of the substrate, and
wherein performing the etching process includes:
adjusting the tilt angle of the ion beam to be at a low angle or at a high angle, in accordance with materials of the lower layer and the mask pattern, to selectively etch the protrusion pattern, the low angle being an angle equal to or less than 60 degrees, and the high angle being an angle greater than 60 degree, and
pre-treating the mask patterns with the ion beam at the adjusted tilt angle to remove the protrusion pattern before etching the lower layer.

19. The method as claimed in claim 18, wherein performing the etching process further includes:
re-adjusting the tilt angle of the ion beam to selectively etch the lower layer; and
etching the lower layer using the pre-treated mask patterns as an etch mask.

20. The method as claimed in claim 18, wherein the protrusion pattern is a portion of the mask patterns, which extends from a sidewall of at least one of the mask patterns.

* * * * *